(12) United States Patent
Yoshizaki et al.

(10) Patent No.: US 7,712,435 B2
(45) Date of Patent: May 11, 2010

(54) PLASMA PROCESSING APPARATUS WITH INSULATED GAS INLET PORE

(75) Inventors: Yu Yoshizaki, Tama (JP); Ryu Nakano, Tama (JP)

(73) Assignee: ASM Japan K.K., Tokyo (JP)

( * ) Notice: Subject to any disclaimer, the term of this patent is extended or adjusted under 35 U.S.C. 154(b) by 368 days.

(21) Appl. No.: 11/237,997

(22) Filed: Sep. 28, 2005

(65) Prior Publication Data

US 2006/0137610 A1 Jun. 29, 2006

(30) Foreign Application Priority Data

Sep. 28, 2004 (JP) ............................. 2004-280887

(51) Int. Cl.
- *C23C 16/507* (2006.01)
- *C23C 16/509* (2006.01)
- *C23C 16/50* (2006.01)
- *C23F 1/00* (2006.01)
- *H01L 21/306* (2006.01)
- *C23C 16/22* (2006.01)
- *C23C 16/06* (2006.01)

(52) U.S. Cl. ............................. 118/723 E; 156/345.33; 156/345.34; 156/345.43; 156/345.45; 118/715

(58) Field of Classification Search .............. 118/723 E, 118/715; 156/345.33, 345.34, 345.43, 345.45
See application file for complete search history.

(56) References Cited

U.S. PATENT DOCUMENTS 5,304,250 A * 4/1994 Sameshima et al. ... 118/723 ER
6,334,983 B1 * 1/2002 Okayama et al. ....... 422/186.29

FOREIGN PATENT DOCUMENTS

JP 2002231169 A * 8/2002

* cited by examiner

*Primary Examiner*—Rudy Zervigon
(74) *Attorney, Agent, or Firm*—Knobbe, Martens, Olson & Bear LLP (57) ABSTRACT

A plasma processing apparatus includes: a reaction chamber; two electrodes provided inside the reaction chamber for generating a plasma therebetween, wherein at least one of the electrodes has at least one gas inlet pore through which a gas is introduced into the reaction chamber; and a gas inlet pipe coupled to the gas inlet pore for introducing the gas into the reaction chamber. The gas inlet pipe is grounded and insulated from the gas inlet pore, wherein an insulation member is placed inside the gas inlet pipe and the gas inlet pore.

25 Claims, 5 Drawing Sheets

PLASMA PROCESSING APPARATUS WITH INSULATED GAS INLET PORE

BACKGROUND OF THE INVENTION

1. Field of the Invention

The present invention generally relates to a plasma processing apparatus and particularly to a plasma processing apparatus having at least one gas inlet pore provided in electrodes for forming a thin film on a semiconductor substrate.

2. Description of the Related Art

Conventionally in the field of semiconductor device manufacturing, plasma processing such as plasma CVD and dry etching is frequently used. Generally, a plasma processing apparatus includes an evacuated reaction chamber, a susceptor installed inside the reaction chamber for placing a semiconductor substrate thereon, and a showerhead installed facing and parallel to the susceptor inside the reaction chamber. The susceptor is grounded and forms one side of electrodes for plasma discharge; the showerhead is connected to a radio-frequency power source provided outside the reaction chamber and forms the other side of the electrodes for plasma discharge. A gas inlet pore is provided in a top plate of the showerhead, and reaction gas inlet piping is linked to the top plate via a ring-shaped insulator. Radio-frequency power is applied to the top plate of the showerhead via a radio-frequency matching box.

SUMMARY OF THE INVENTION

When radio-frequency power is applied, a phenomenon that radio-frequency waves flow from the top late to the piping side because a potential voltage difference occurs between the top plate and an inner wall of the gas inlet piping which is ground potential, and plasma is generated between the two, and dissociation of processing gas takes place. As a result, a product adheres to an inner side of the gas inlet piping and the gas inlet pore, exfoliates, passes through the showerhead, and becomes the source of contamination. Additionally, inner parts of the piping corrode by plasma discharge, from which metal powder is generated and becomes the source of contamination.

Such contamination not only remarkably lowers the reliability of semiconductor parts but also reduces throughput, which leads to manufacturing cost increase. Additionally, plasma discharge occurring inside the piping deteriorates the inside of the piping. By this, frequency of piping replacement increases and cost performance decreases. Further, throughput of semiconductor products is lowered.

Consequently, the present invention is intended to solve at least one of the problems, and an objection of the present invention, which is not intended to limit the present invention, is to provide a plasma processing apparatus which can suppress generation of plasma discharge inside the gas inlet piping and the gas inlet pore and prevent adhering of contaminants.

In an aspect, the present invention provides a plasma processing apparatus comprising: (i) a reaction chamber; (ii) two electrodes provided inside the reaction chamber for generating a plasma therebetween, wherein at least one of the electrodes has at least one gas inlet pore through which a gas is introduced into the reaction chamber; and (iii) a gas inlet pipe coupled to the gas inlet pore for introducing the gas into the reaction chamber, said gas inlet pipe being grounded and insulated from the gas inlet pore, wherein an insulation member is placed inside the gas inlet pipe and the gas inlet pore.

The above aspect may include, but may not be limited to, the following embodiments.

The insulation member is configured to suppress a potential voltage difference which would occur between the at least one of the electrodes and an inner wall of the gas inlet pipe at the gas inlet pore without the presence of the insulation member when radio-frequency power is applied to the electrodes.

The insulation member may be a tubular insulator installed inside the gas inlet pipe and the gas inlet pore.

The plasma processing apparatus may be a capacitive coupled plasma CVD apparatus wherein the electrodes are placed in parallel to each other. In the above, the at least one of the electrodes may be a showerhead, and the gas inlet pipe may be to introduce a reaction gas into the reaction chamber through the showerhead.

The gas inlet pipe and the gas inlet pore may be insulated by a ring-shaped insulator. In the above, the tubular insulator and the ring-shaped insulator may be formed integrally.

The insulation member may be composed of aluminum or magnesium oxide or aluminum or magnesium nitride. Alternatively, the insulation member may be composed of a fluorine-containing resin.

The insulation member may have a thickness of 3-20 mm radially.

In another aspect, the present invention provides a plasma processing apparatus comprising: (i) a reaction chamber; (ii) two electrodes provided inside the reaction chamber for generating a plasma therebetween, wherein at least one of the electrodes has at least one gas inlet pore through which a gas is introduced into the reaction chamber; (iii) a gas inlet pipe coupled to the gas inlet pore for introducing the gas into the reaction chamber; and (iv) an insulator having a through-hole connected between the gas inlet pipe and the gas inlet pore of the electrode, wherein the gas inlet pipe, the insulator, and the gas inlet pore are connected to form a gas passage inner surface constituted by an inner wall of the gas inlet pipe, an inner periphery of the through-hole of the insulator, and an inner periphery of the gas inlet pore, said gas passage inner surface being insulated.

The above aspect may further include, but may not be limited to, the following embodiments:

The gas inlet pipe may be made of a conductive material and grounded, and the inner wall of the gas inlet pipe is insulated with an insulation material.

The inner wall of the gas inlet pipe, the inner periphery of the through-hole of the insulator, and the inner periphery of the gas inlet pore may be insulated with a common insulation member. The common insulation member may be a tubular insulator fitted inside the gas inlet pipe, the through-hole of the insulator, and the gas inlet pore.

The inner wall of the gas inlet pipe may be insulated from an edge connected to the inner periphery of the insulator to a point away from the edge by a distance effective to suppress an occurrence of plasma discharge at the gas inlet pore.

In all of the aforesaid aspects and embodiments, any element used in an aspect or embodiment can interchangeably or additionally be used in another aspect or embodiment unless such a replacement or addition is not feasible or causes adverse effect. Further, the present invention can equally be applied to apparatuses and methods.

According to one or more embodiments of the present invention, one or more of the problems can be solved by suppressing plasma discharge inside the gas inlet piping and the gas inlet pore, thereby preventing adhering of products to an inner wall of the gas inlet piping and the gas inlet pore and a deterioration in the upper electrode by a plasma from becoming the source of contamination. As a result, in at least one embodiment, it becomes possible to prevent a decline in yield, increase in piping replacement frequency, a lowering of cost performance, and a drop in throughput of semiconductor products.

Further, in at least one embodiment, it becomes possible to suppress arc which would occur between the upper electrode and a wall of the reaction chamber when AC current flows between the upper and lower electrodes (DC bias voltage, Vdc, between the upper and lower electrodes can be maintained at minus values).

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes.

DETAILED DESCRIPTION OF THE PREFERRED EMBODIMENT

Preferred embodiments of the present invention are described with reference to drawings attached. The embodiments and the drawings are not intended to limit the present invention.

Figure 1:
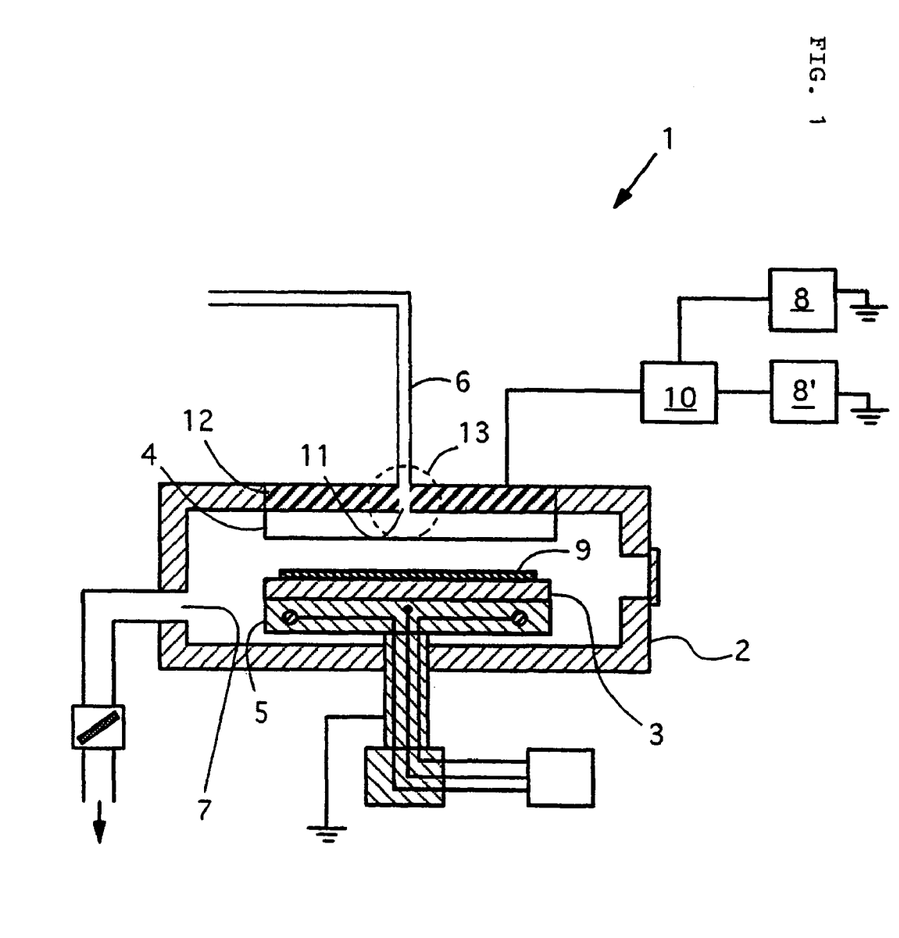
FIG. 1 is a schematic diagram of a plasma processing apparatus according to an embodiment of the present invention.

FIG. 1 is a schematic view of a plasma processing apparatus according to an embodiment of the present invention.

The plasma CVD apparatus includes a reaction chamber 2. Inside the reaction chamber 2, a susceptor 3 for placing a semiconductor substrate 9 thereon is installed. The susceptor 3 is supported by a heater block 5 and grounded and forms one side of electrodes for plasma discharge. Inside the reaction chamber 2, a showerhead 4 is provided parallel to and facing the susceptor 3. At the underside of a shower plate 28 in a lower portion of the showerhead 4, thousands of fine pores (not shown) for jetting out reaction gas uniformly to the semiconductor substrate 9 are provided. Between the shower plate 28 and a top plate 12, a gas diffusion plate 21 is provided in a space 29 (See FIGS. 2 (A), 2 (B), and 4). Gas inlet piping 6 for introducing the reaction gas into the reaction chamber 2 is linked to a gas inlet pore II provided in the top plate 12 of the showerhead 4. After being supplied from the gas inlet piping 6 is diffused by the gas diffusion plate 21 of the showerhead, the reaction gas is jetted out onto the semiconductor wafer 9 uniformly through the fine pores. An exhaust port 7 is provided in the reaction chamber 2 and is linked to an external vacuum pump (not shown). Outside the reaction chamber 2, radio-frequency power sources (8, 8') are provided and supply radio-frequency power to the top plate 12 via a matching box 10. Types of thin films formed on the semiconductor substrate 9 include silicon oxide films (e.g., USG, BPSG, PSG, SiON), low-dielectric-constant fluorine-containing silicon films, low-dielectric-constant carbon-containing silicon oxide films, oxygen-containing silicon films, silicon carbide films, silicon nitride films and amorphous silicon films.

Figure 4:
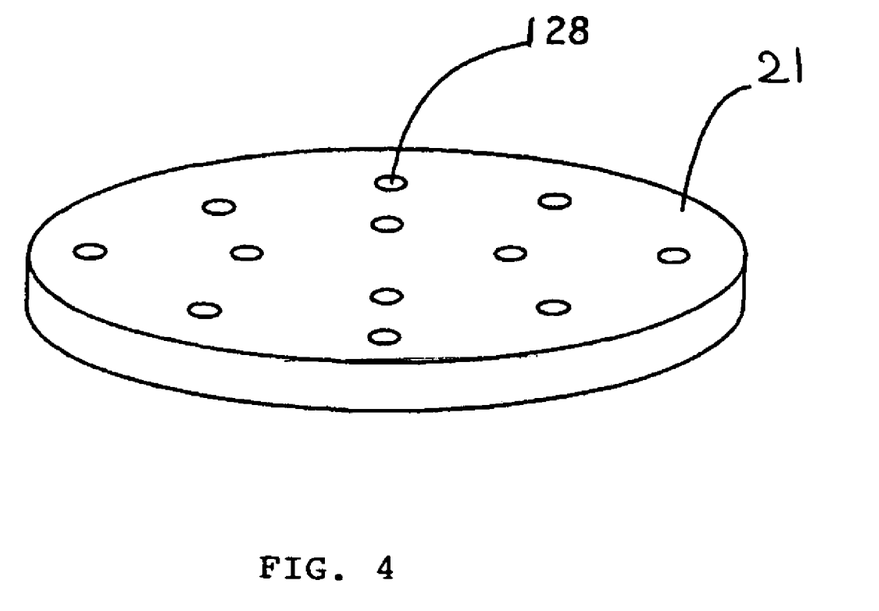
FIG. 4 is a schematic diagram of a gas diffusion plate usable in an embodiment of the present invention.

In the above, the gas diffusion plate 21 is for diffusing gas and may have a configuration shown in FIG. 4 which is similar to that of the shower plate. The gas diffusion plate 21 has a plurality of pores 128 which may be fewer than those of the shower plate 28. The gas diffusion plate can be omitted in an embodiment.

The apparatus shown in FIG. 1 is a plasma CVD apparatus. However, the present invention can be applied to any suitable plasma processing apparatus. For example, the apparatus may include those for PECVD (plasma enhanced CVD), plasma ALD (atomic layer deposition), high density plasma CVD, and plasma etching. The apparatus can be provided with a remote plasma generation chamber (see FIG. 5 which will be explained later). Further, the type of apparatus need not be limited to a capacitive coupled plasma CVD type shown in FIG. 1.

In FIG. 1, the apparatus comprises one gas inlet pipe which is the gas inlet piping 6, and one gas inlet pore which is the gas inlet pore 11. However, in another embodiment, more than one gas inlet pipes (e.g., two or three) can be installed (e.g., each supplying a different gas). Further, the gas inlet pipe need not be located at a center and can be installed on a side of the showerhead 4. Further, in an embodiment, the apparatus (such as an ALD apparatus) has a showerhead provided also with gas exhaust piping and a gas exhaust pore. The present invention can be applied to any of the above embodiments where a gas pipe is connected to and insulated from a showerhead.

Furthermore, in another embodiment, the present invention can be applied to a lower electrode. In FIG. 1, the showerhead 4 serves as one of the electrodes and constitutes the upper electrode. The susceptor 3 serves as the other electrode, i.e., a lower electrode. In an embodiment, the susceptor is provided with one or more through-holes for introducing gas (e.g., an inert gas) into the reaction space during a deposition process in order to prevent deposition of particles on the backside of a wafer. In this case, the gas through-hole is connected to a pipe which is insulated from the susceptor.

Figure 2A:
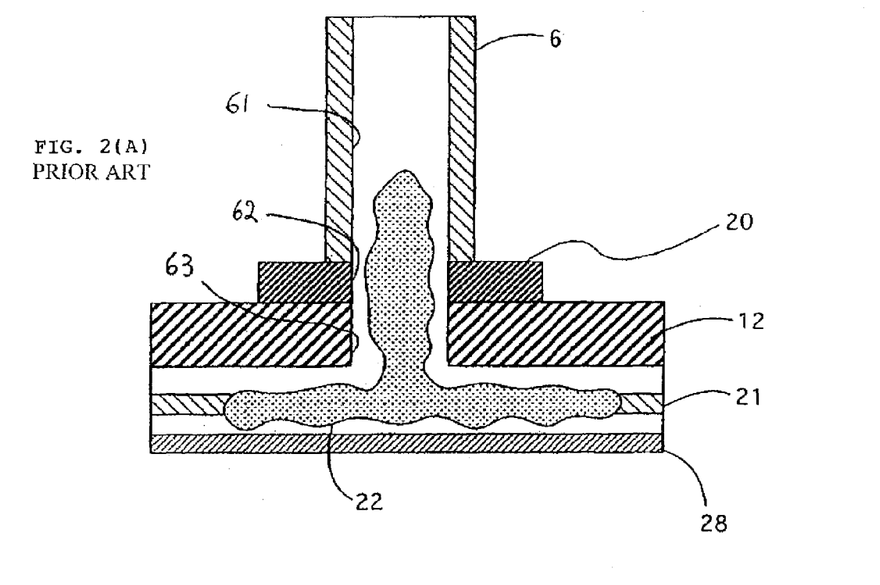
FIG. 2(A) is an enlarged view of a gas introduction portion of a conventional plasma CVD apparatus.
Figure 2B:
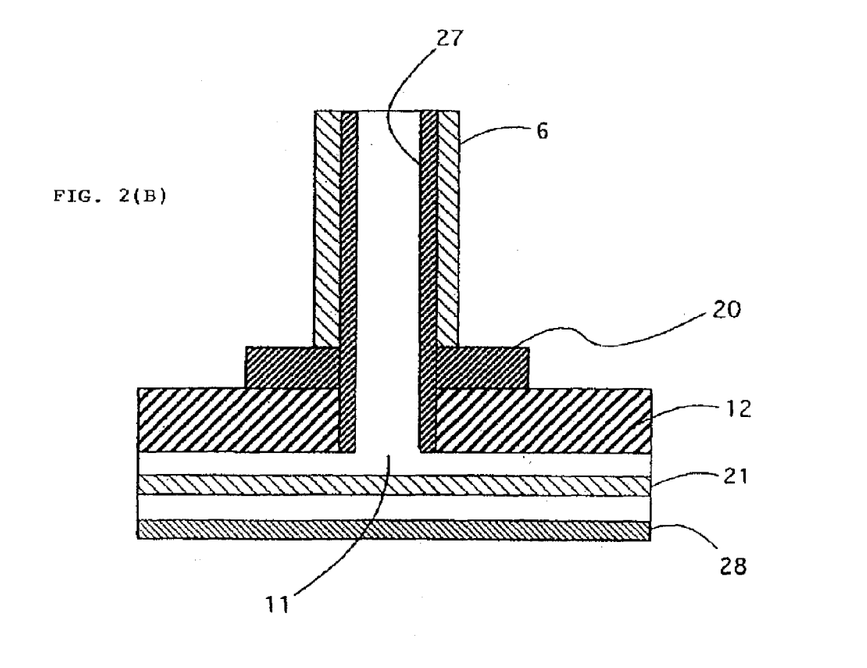
FIG. 2(B) is an enlarged view of a gas introduction portion of a plasma CVD apparatus according to an embodiment of the present invention.

FIGS. 2(A) and 2(B) are enlarged views of Area 13 in FIG. 1. FIG. 2(A) shows a conventional plasma CVD apparatus. As described above, in the conventional plasma CVD apparatus, a ring-shaped insulator 20 is provided between a top plate 12 and gas inlet piping 6. When radio-frequency power is applied to the top plate 12, a potential difference occurs between the top plate and the gas inlet piping 6, and generated plasma discharge 22 passes through the gas inlet pore 11 provided in the top plate 12 and enters into the gas inlet piping 6. As a result, inside the gas inlet piping, dissociation of the reaction gas takes place and products adhere to an inner wall surface of the gas inlet piping 6 and the gas inlet port 11.

Figure 5:
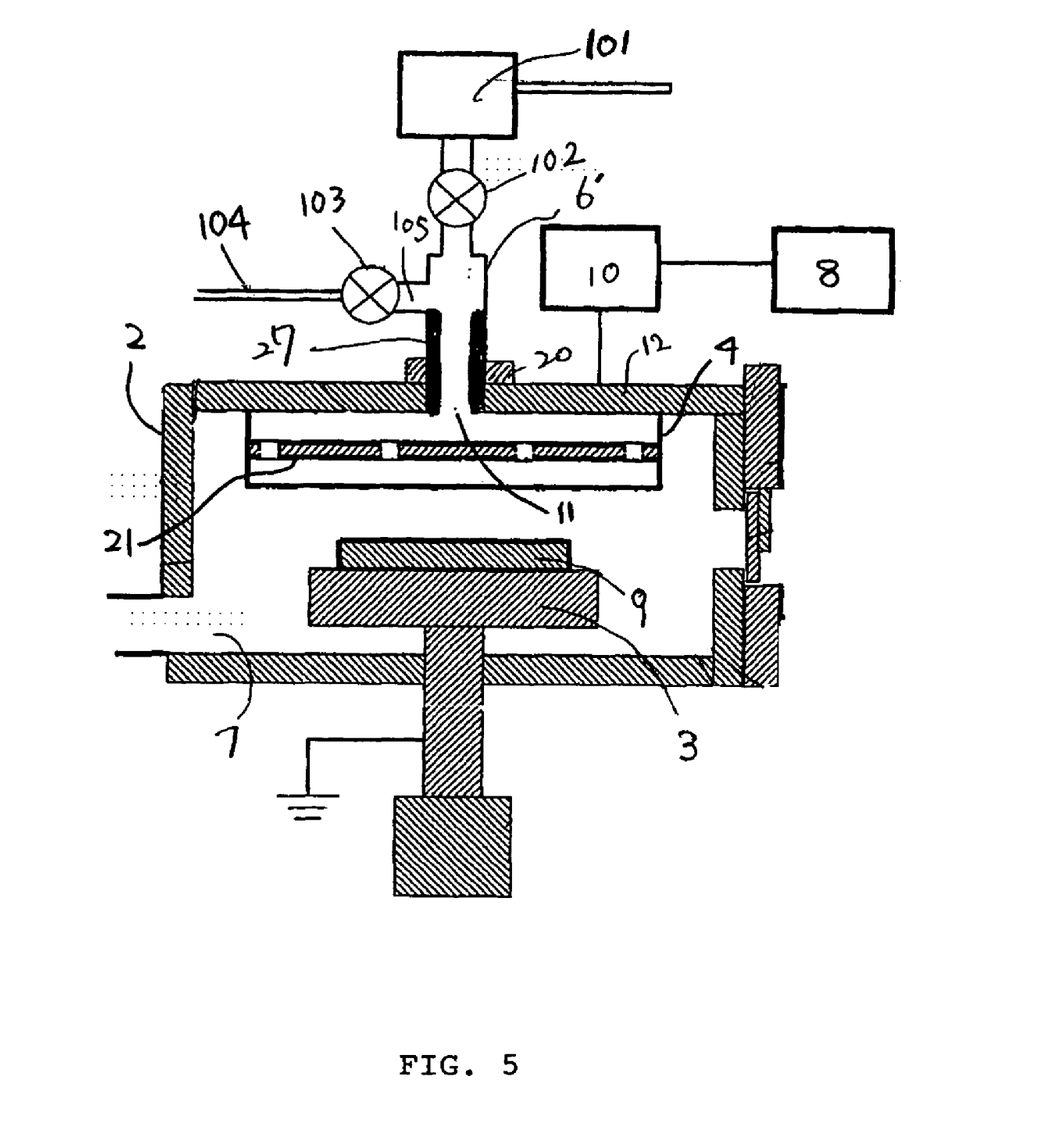
FIG. 5 is a schematic diagram of a plasma processing apparatus according to another embodiment.

Plasma discharge can be observed from a top of the gas inlet pipe 6 which is modified for observation purposes to have a small window so as to observe inside from the top (e.g., a valve 102 and a remote plasma unit 101 are removed and replaced with a window for observation purposes in FIG. 5). Further, if the showerhead is disassembled after the apparatus runs for an extended time period, deposition of particles can be observed. Furthermore, by monitoring DC bias voltage (Vdc) between the upper and lower electrodes, the occurrence of plasma discharge can be detected. That is, Vdc is positive if AC current flows between the upper and lower electrodes. AC current may flow if plasma discharge occurs and a potential voltage difference occurs between the gas inlet piping 6 and the top plate 12. If AC current flows between the upper and lower electrodes, arc occurs. If no plasma discharge occurs or negligible intensity of plasma discharge occurs, Vdc is negative. Vdc can be measured by measuring voltage between the matching box 10 (the RF power source) and the showerhead 4 (the ungrounded electrode) using a known Vdc measurement circuit.

FIG. 2 (B) is an enlarged view of a gas introduction portion of an improved plasma CVD apparatus according to an embodiment of the present invention. In an embodiment of the present invention, a tubular insulator 27 as an example of the insulation member is installed inside gas inlet piping 6 and a gas inlet pore 11. An axial length of the insulator 27 may extend at least to the entire inner side of the piping and the gas inlet pore 11. A ring-shaped insulator 20 and the tubular insulator 27 are cast preferably integrally, but they may be manufactured separately and then fitted together.

The gas inlet piping 6 may be made of a conductive material such as stainless steel (e.g., SUS316) or aluminum. The ring-shaped insulator 20 may have a thickness of 5-30 mm (e.g., about 20 mm) and be fixed to the top plate 12 with screws. The top plate 12 may have a thickness of 30-80 mm (e.g., about 50 mm). The top plate 12 may be made of a conductive material such as aluminum.

The insulator 27 may be composed of aluminum or magnesium nitride, aluminum or magnesium oxide, or fluorine-containing resin. Preferably, a material for the insulator is selected from a group consisting of aluminum nitride, magnesium oxide, aluminum oxide and fluoride-containing resin (e.g., polydifluoroethylene (brand name: Teflon®)). A radial thickness of the tubular insulator 27 may be about 3 mm to about 20 mm, preferably 3-10 mm. Axial and radial thicknesses of the insulator can be selected depending on the type and size of apparatus, for example. For example, the insulator may have a length (axial thickness) of about 150 mm to about 200 mm (in another embodiment, about 100 mm to about 300 mm depending on the configuration and size of the apparatus). The ring-shaped insulator 20 can also be composed of the above material.

In FIG. 2(b), the tubular insulator 27 is installed inside the gas inlet piping 6, the ring-shaped insulator 20, and the gas inlet pore 12. However, any suitable modifications can be made as long as a potential voltage difference can be suppressed between the gas inlet piping and the top plate. In an embodiment, an inner surface 61 of the gas inlet piping 6 (see FIG. 2(A)) and an inner periphery 63 of the gas inlet pore 11 are coated with an insulation material (such as those described above) or covered with an oxide film formed by anodizing treatment on the order of hundreds micron or a few mm, for example. An inner periphery 62 of the ring-shaped insulator need not be coated or covered with an insulation material. In another embodiment, the inner periphery 63 of the gas inlet pore 11 is coated or covered with an insulation material or provided with a ring-shaped insulator fitted inside the inner periphery 63, and the gas inlet piping 6 itself is made of an insulation material. This embodiment can be suitable if no heavy load is applied to the gas inlet piping. If a remote plasma generation chamber is mounted using the gas inlet piping, the gas inlet piping needs to have sufficient strength, and may require reinforcement. For example, a metal support can be used outside the gas inlet piping made of an insulation material, or the thickness of the gas inlet piping can be increased.

Further, the ring-shaped insulator 20 need not be used as long as the gas inlet piping and the top plate are insulated. For example, in the case where the gas inlet piping is made of an insulation material, no additional insulator such as the ring-shaped insulator is required. Further, the insulator 20 need not be ring-shaped as long as the gas inlet piping and the top plate are insulated (e.g., a triangle or square with a through-hole can be used). The gas inlet piping 6 may have a circular cross section but can have an oval or other rounded cross section.

In FIG. 2(B), the tubular insulator 27 is a single piece. However, it can be comprised of two or three pieces. For example, a portion covering the inner wall 61 of the gas inlet piping and a portion covering the inner periphery 63 of the gas inlet pore 11 can be separate pieces. In this case, no additional insulator is required to cover the inner periphery 62 of the ring-shaped insulator 20. Further, in FIG. 2(B), the lower end of the tubular insulator 27 may be leveled with a lower surface of the top plate 12. However, the lower end of the tubular insulator 27 can slightly protrude from or shorter than the lower surface of the top plate 12.

FIG. 5 is a schematic diagram of a plasma processing apparatus according to another embodiment wherein a remote plasma unit 101 is disposed above the gas inlet piping 6' via a gas valve 102. A process gas supply pipe 104 is connected to the gas inlet piping 6' via a gas valve 103. In this embodiment, the tubular insulator 27 (oversimplified for illustrative purposes) covers an inner surface defined between a lower end of the gas inlet pore 11 and a point underneath a joint portion of the gas inlet piping 6 where a process gas inlet port 105 is formed.

In an embodiment, the inner wall of the gas inlet piping 6, 6' is insulated from an edge connected to the inner periphery of the insulator to a point away from the edge by a distance effective to suppress an occurrence of plasma discharge at the gas inlet pore. In an embodiment, an insulation member is configured to suppress a potential voltage difference which would occur between the electrode and the inner wall of the gas inlet piping at the gas inlet pore 11 without the presence of the insulation member when radio-frequency power is applied to the electrodes.

According to at least one embodiment of the present invention, because the inner wall surface of the gas inlet piping 6 and the gas inlet pore 11 are insulated, generation of plasma discharge can be suppressed.

EXAMPLES

The present invention will be explained with reference to the following examples. However, the examples are not intended to limit the present invention.

Thin-film formation experiments were conducted using a conventional plasma CVD apparatus and a plasma CVD apparatus according to an embodiment of the present invention (FIG. 2(B)). The tubular insulation was installed inside the a gas passage inner surface constituted by the inner wall 61 of the gas inlet piping 6, the inner periphery 62 of the ring-shaped insulator 20, and the inner periphery 63 of the gas inlet pore 11. The tubular insulator 27 had a radial thickness of 20 mm, an axial thickness (length) of 200 mm, and an inner diameter of 40 mm. In this case, the tubular insulator 27 covered a vertical portion of the gas inlet piping 6 in its entirety. The tubular insulator was made of aluminum oxide or magnesium oxide.

In the experiments, an oxygen-doped silicon carbide film and a nitrogen-doped silicon carbide film were formed. The respective films were formed under experimental conditions described below. The number of wafers on which films were formed was 25 for each film type.

Figure 3:
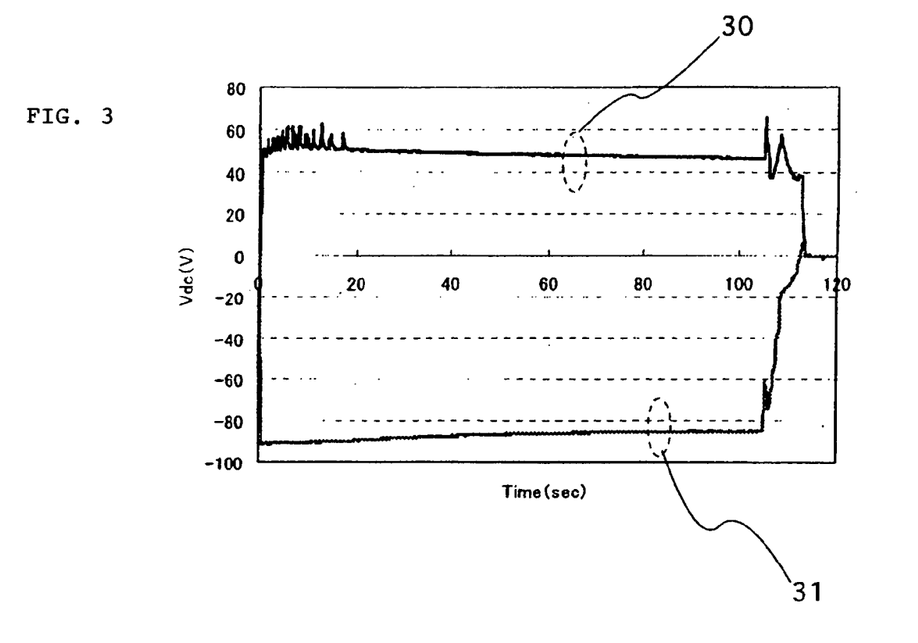
FIG. 3 shows comparison of DC bias voltage occurring in an upper electrode during film formation processing between the conventional plasma CVD apparatus and a plasma CVD apparatus according to an embodiment of the present invention.

(1) Film Type: Oxygen-Doped Silicon Carbide Film
Source gas: Tetramethylsilane 500 sccm
  Helium 3.5 slm
  Carbon dioxide 3.0 slm
First radio-frequency power (HRF): 27 MHz, 800 W
Second radio-frequency power (LRF): 400 KHz, 250 W
Substrate: φ300 mm silicon substrate
Cleaning frequency: Single wafer (2) Film Type: Nitrogen-Doped Silicon Carbide Film
Source gas: Tetramethylsilane 400 sccm
  Ammonia 600 sccm
  Helium 4.0 slm
First radio-frequency power (HRF): 27 MHz, 1000 W
Second radio-frequency power (LRF): 400 KHz, 250 W
Substrate: φ300 mm silicon substrate
Cleaning frequency: Single wafer Under these conditions, thin-film formation experiments were conducted using a conventional plasma CVD apparatus and a plasma CVD apparatus according to this embodiment of the present invention. Regarding one semiconductor wafer arbitrarily picked out from 25 semiconductor wafers, change in bias voltage Vdc occurring in the upper electrode in respective apparatuses with time during the thin-film formation was measured using a conventional Vdc measurement circuit provided between the matching box and the showerhead. FIG. 3 shows experimental results. Measurement data shown in FIG. 3 is regarding film formation of the nitrogen-doped silicon film.

In the thin-film formation experiment using the conventional plasma CVD apparatus, a Vdc waveform 30 exists on the positive side, and generation of plasma discharge inside the gas inlet piping 6 and the gas inlet pore 11 was able to be confirmed with eyes. In the thin-film formation experiment using the plasma CVD apparatus according to this embodiment of the present invention, a Vdc waveform 31 exists on the negative side, and generation of plasma discharge inside the gas inlet piping 6 and the gas inlet pore 11 was not able to be confirmed. Additionally, in this embodiment of the present invention, even at the start of the deposition process, Vdc did not fluctuate (no plasma discharge occurred).

The present invention includes the above mentioned embodiments and other various embodiments including the following:

1) A plasma processing apparatus comprising a reaction chamber, gas inlet piping for introducing reaction gas into said reaction chamber, an upper electrode provided inside said reaction chamber, in which a gas inlet pore for introducing said reaction gas into said reaction chamber is provided, and a ring-shaped insulator installed between said gas inlet piping and said upper electrode, which is characterized in that a tubular insulator is installed inside said gas inlet piping and said gas inlet pore.

2) The plasma processing apparatus according to 1), wherein said respective insulators are formed integrally.

3) The plasma processing apparatus according to 1), wherein said respective insulators are formed independently.

4) The plasma processing apparatus according to 1), wherein said insulator is composed of aluminum or magnesium oxide or aluminum or magnesium nitride.

5) The plasma processing apparatus according to 1), wherein said insulator is composed of fluorine-containing resin.

6) The plasma processing apparatus according to 1), wherein said insulator is composed of a material selected from a group consisting of aluminum oxide, aluminum nitride and magnesium oxide.

7) The plasma processing apparatus according to 1), wherein said tubular insulator has a thickness of 3-20 mm radially.

8) The plasma processing apparatus according to 1), wherein said tubular insulator has a thickness of 3-10 mm radially.

9) A plasma CVD apparatus for forming a thin film on a semiconductor substrate by plasma CVD comprising (i) a reaction chamber, (ii) a susceptor for placing said semiconductor substrate thereon installed inside said reaction chamber, (iii) a showerhead provided parallel to and facing said susceptor for jetting out reaction gas uniformly to said semiconductor substrate, (iv) a radio-frequency power source for supplying radio-frequency power to said showerhead, (v) a gas inlet pore provided in said showerhead, and (vi) gas inlet piping connected to said showerhead, wherein inside said gas inlet piping and said gas inlet pore, a tubular insulator is installed.

10) The apparatus according to 9), wherein said insulator is composed of aluminum or magnesium oxide, aluminum or magnesium nitride, or fluorine-containing resin.

11) The apparatus according to 9), wherein said thin film is selected from a group consisting of a silicon oxide film, fluorine-containing silicon film, carbon-containing silicon oxide film, oxygen-containing silicon carbide film, silicon carbide film, and silicon nitride film, and amorphous silicon film.

The present application claims priority to Japanese Patent Application No. 2004-280887, filed Sep. 28, 2004, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A plasma processing apparatus comprising:
   a reaction chamber;
   two electrodes provided inside the reaction chamber for generating a plasma therebetween, wherein one of the electrodes is a showerhead comprised of a top plate, a shower plate, and a space formed between the top plate and the shower plate, said top plate having at least one gas inlet pore for introducing a gas into the space therethrough, said shower plate having multiple holes for introducing the gas included inside the space into the reaction chamber therethrough; and
   a gas inlet pipe coupled to the gas inlet pore for introducing the gas into the space, said gas inlet pipe being insulated from the gas inlet pore at a boundary between the gas inlet pipe and the top plate, wherein an insulation member is placed inside the gas inlet pipe upstream of the boundary and inside the gas inlet pore downstream of the boundary, wherein the gas inlet pipe is grounded whereas the top plate having the gas inlet pore has a potential voltage such as would generate an arc discharge between the top plate at the gas inlet pore and the gas inlet pipe without the insulation member, and wherein the insulation member covers an area continuously from a portion of the inside of the gas inlet pipe, through the boundary, to a portion of the inside of the gas inlet pore so as to suppress generation of an arc discharge between the gas inlet pipe and the top plate at the gas inlet pore.

2. The plasma processing apparatus according to claim 1, wherein the insulation member is configured to suppress a potential voltage difference which would occur between the showerhead and an inner wall of the gas inlet pipe at the gas inlet pore without the presence of the insulation member when radio-frequency power is applied to the electrodes.

3. The plasma processing apparatus according to claim 1, wherein the insulation member is a tubular insulator installed inside the gas inlet pipe and the gas inlet pore.

4. The plasma processing apparatus according to claim 1, which is a capacitive coupled plasma CVD apparatus wherein the electrodes are placed in parallel to each other.

5. The plasma processing apparatus according to claim 3, wherein the gas inlet pipe and the gas inlet pore are insulated by a ring-shaped insulator.

6. The plasma processing apparatus according to claim 5, wherein the tubular insulator and the ring-shaped insulator are formed integrally.

7. The plasma processing apparatus according to claim 1, wherein the insulation member is composed of aluminum or magnesium oxide or aluminum or magnesium nitride.

8. The plasma processing apparatus according to claim 1, wherein the insulation member is composed of a fluorine-containing resin.

9. The plasma processing apparatus according to claim 1, wherein the insulation member has a thickness of 3-20 mm radially.

10. A plasma processing apparatus comprising:
a reaction chamber;
two electrodes provided inside the reaction chamber for generating a plasma therebetween, wherein one of the electrodes is a showerhead comprised of a top plate, a shower plate, and a space formed between the top plate and the shower plate, said top plate having at least one gas inlet pore for introducing a gas into the space therethrough, said shower plate having multiple holes for introducing the gas included inside the space into the reaction chamber therethrough;
a gas inlet pipe coupled to the gas inlet pore for introducing the gas into the space; and
an insulator having a through-hole connected between the gas inlet pipe and the gas inlet pore of the top plate,
wherein the gas inlet pipe, the insulator, and the gas inlet pore are connected to form a gas passage inner surface constituted by an inner wall of the gas inlet pipe, an inner periphery of the through-hole of the insulator, and an inner periphery of the gas inlet pore,
wherein said gas inlet pipe is grounded whereas the top plate having said gas inlet pore has a potential voltage such as would generate an arc discharge between the top plate at the gas inlet pore and the gas inlet pipe without the insulator, and wherein said inner wall of the gas inlet pipe, said inner periphery of the through-hole of the insulator, and said inner periphery of the gas inlet pore of the top plate are continuously covered by an insulation material so as to suppress generation of an arc discharge between the gas inlet pipe and the top plate at the gas inlet pore.

11. The plasma processing apparatus according to claim 10, wherein the gas inlet pipe is made of a conductive material and grounded, and the inner wall of the gas inlet pipe is insulated with the insulation material.

12. The plasma processing apparatus according to claim 10, wherein the inner wall of the gas inlet pipe, the inner periphery of the through-hole of the insulator, and the inner periphery of the gas inlet pore are insulated with a common insulation member made of the insulation material.

13. The plasma processing apparatus according to claim 12, wherein the common insulation member is a tubular insulator fitted inside the gas inlet pipe, the through-hole of the insulator, and the gas inlet pore.

14. The plasma processing apparatus according to claim 10, which is a capacitive coupled plasma CVD apparatus wherein the electrodes are placed in parallel to each other.

15. The plasma processing apparatus according to claim 13, wherein the insulator connected between the gas inlet pipe and the gas inlet pore is a ring-shaped insulator.

16. The plasma processing apparatus according to claim 15, wherein the tubular insulator and the ring-shaped insulator are formed integrally.

17. The plasma processing apparatus according to claim 15, wherein the tubular insulator and the ring-shaped insulator are formed separately.

18. The plasma processing apparatus according to claim 13, wherein the tubular insulator is composed of aluminum or magnesium oxide or aluminum or magnesium nitride.

19. The plasma processing apparatus according to claim 13, wherein the tubular insulator is composed of a fluorine-containing resin.

20. The plasma processing apparatus according to claim 11, wherein the insulation material is aluminum or magnesium oxide or aluminum or magnesium nitride.

21. The plasma processing apparatus according to claim 11, wherein the insulation material is a fluorine-containing resin.

22. The plasma processing apparatus according to claim 13, wherein the tubular insulator has a thickness of 3-20 mm radially.

23. The plasma processing apparatus according to claim 10, wherein the inner wall of the gas inlet pipe is insulated from an edge connected to the inner periphery of the insulator to a point away from the edge by a distance effective to suppress an occurrence of plasma discharge at the gas inlet pore.

24. The plasma processing apparatus according to claim 1, further comprising a diffusion plate between the top plate and the shower plate.

25. The plasma processing apparatus according to claim 10, further comprising a diffusion plate between the top plate and the shower plate.

* * * * *

UNITED STATES PATENT AND TRADEMARK OFFICE
CERTIFICATE OF CORRECTION

PATENT NO.      : 7,712,435 B2                              Page 1 of 1
APPLICATION NO. : 11/237997
DATED           : May 11, 2010
INVENTOR(S)     : Yu Yoshizaki and Ryu Nakano It is certified that error appears in the above-identified patent and that said Letters Patent is hereby corrected as shown below:

FIG. 2(B) on Sheet 2 of Drawings is replaced with the drawing below:

At column 4, line 6, after "pore" change "II" to --11--.

Signed and Sealed this

Twelfth Day of October, 2010

David J. Kappos
Director of the United States Patent and Trademark Office